ns**

United States Patent [19]
Gilding

[11] 3,986,653
[45] Oct. 19, 1976

[54] METHOD FOR COATING BONDING TOOLS AND PRODUCT

[75] Inventor: Denis K. Gilding, Mountain View, Calif.

[73] Assignee: Tribotech, Redwood City, Calif.

[22] Filed: Sept. 3, 1974

[21] Appl. No.: 502,537

[52] U.S. Cl. .................. 228/44.1 A; 204/14 N; 204/38 R; 228/54; 228/4.5
[51] Int. Cl.² .................. B23K 19/00; C25D 3/02
[58] Field of Search .......... 204/14 N, 47, 38 R, 204/25, 15, 16, 38 C; 228/44.1 A, 54, 4.5

[56] References Cited
UNITED STATES PATENTS

| | | | |
|---|---|---|---|
| 3,007,855 | 11/1961 | Ellwood | 204/16 |
| 3,220,972 | 11/1965 | Lamoreaux | 204/47 |
| 3,433,682 | 4/1969 | Kalnin | 204/38 R |
| 3,692,642 | 9/1972 | Notley et al. | 204/47 |
| 3,720,590 | 3/1973 | DeWitt et al. | 204/14 N |

*Primary Examiner*—T. M. Tufariello
*Attorney, Agent, or Firm*—Flehr, Hohbach, Test, Albritton & Herbert

[57] ABSTRACT

A method for the electrodeposition of osmium, ruthenium or their alloys from alkali metal salts of the same in a nonaqueous solvent capable of permitting dissociation of the salt and having low surface tension (e.g., methanol or dimethyl formamide) or mixtures. A silicone layer chemically bonded to the surface of said electrodeposited layer. Also, a bonding tool having a tip coated by either of the above electrodeposited layer or the silicone layer, or both.

30 Claims, 3 Drawing Figures

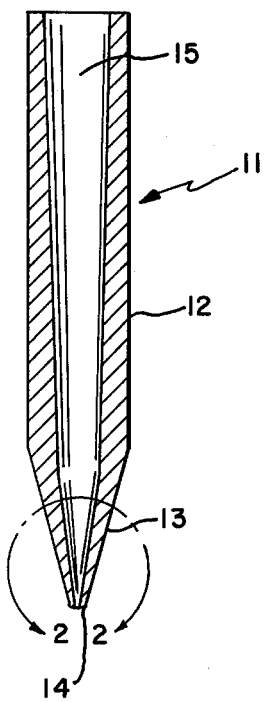
FIG.—1
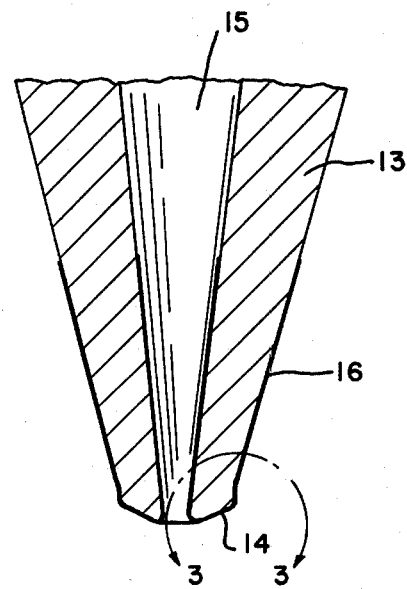
FIG.—2
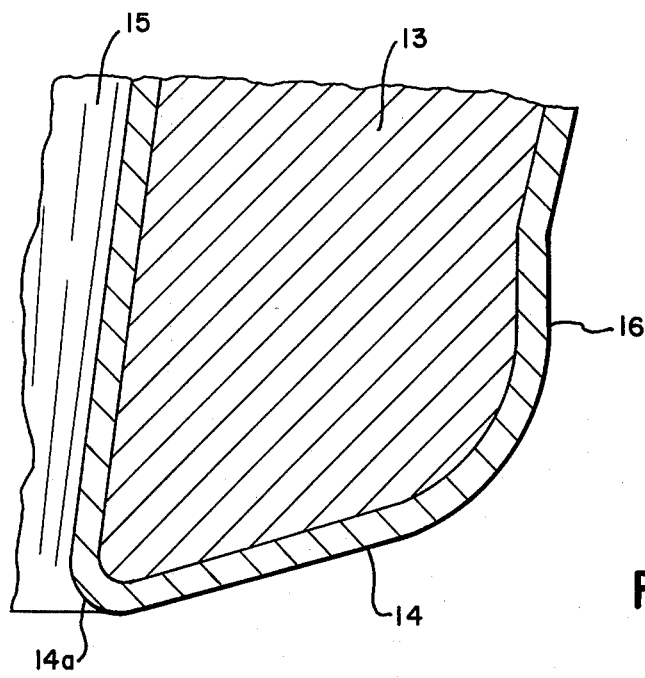
FIG.—3

METHOD FOR COATING BONDING TOOLS AND PRODUCT

BACKGROUND OF THE INVENTION

This invention relates generally to a method for the electrodeposition of the hard metals, osmium, ruthenium or alloys of the same, as a layer on a wear surface. Such hard metals are particularly well suited for coating the working surface of a wire bonding tool of the capillary or wedge type for use in the semiconductor industry. The invention also relates to the deposition of a silicone layer onto the same working surfaces.

Bonding tools of the foregoing type are set forth in U.S. Pat. No. 3,627,192, including a shank of material having a high modulus of elasticity such as tungsten carbide with one end portion forming a bonding tip. A wire guiding hole presents the wire to be bonded to the tip. The wear surface of the end portion of the tool is formed of osmium alloy which is brazed to the tungsten carbide shank. Osmium is an extremely hard material. It provides an improved wire bond and increased tool life. Bonding wedges and capillaries of various shapes and designs are known.

Separate osmium tips of the foregoing type are subject to a number of disadvantages. Such tips are difficult to braze precisely to the tungsten carbide shank leading to a rate of rejects on the order of 10–20%. Furthermore, in economical practice the wire opening is formed primarily of tungsten carbide with a substantially higher coefficient of friction than osmium, leading to wear out and roughening of the barrel on movement of the wire in the opening. Also, each tip is formed individually with precision brazing, grinding and shaping which is inefficient and costly on a mass production scale.

In U.S. Pat. No. 3,622,474, a technique is disclosed for electrodepositing osmium onto low-emission grid wires in cathode ray tubes to utilize its property of low electron emissivity not its wear resistance or low coefficient of friction. The osmium is disclosed as being plated from an aqueous plating solution at elevated temperatures approaching the boiling point of the water. Thus, there is a severe evaporation problem during electroplating. The disclosed technique would not be effective for plating the surface of microstructural bonding tools of the foregoing type because of the relatively high surface tension of the aqueous electrolytic bath which causes the solution to uncontrollably wet the surface. This results in an uneven coating which distorts the precise microgeometry of the substrate. Also, the grain size of the electrodeposited metal is relatively coarse which adds to further distortion of the microgeometry of the plated surface. This lack of precision from the above two sources is seriously detrimental to the precise coating of microsurfaces such as extremely fine openings in the bonding tools of the type set forth in the aforementioned U.S. Pat. No. 3,627,192.

Another problem common to use the foregoing bonding tools is galling or depositing of the wire on the working surface of the tools. This typically leads to the requirement of performing at least about a dozen wire test bonds with each tool prior to formation of repeatable good bonds.

Tool steel is an inexpensive material from which to form a bonding tool. However, it is subject to rusting and the above galling problem.

CROSS-REFERENCE TO RELATED APPLICATION

Reference is made to co-pending U.S. Pat. application, Ser. No. 502,560, filed simultaneously herewith entitled "Bonding Tool".

SUMMARY OF THE INVENTION AND OBJECTS

It is an object of the present invention to provide an improved method for the electrodeposition of osmium or ruthenium.

It is a specific object of the invention to provide a method of the above type especially suited for precisely coating microstructures such as wire bonding tools of the capillary or wedge type used in the semiconductor industry.

It is another object of the invention to provide a method for coating a nongalling silicone layer onto the wear surface of semiconductor bonding tools.

It is a further object of the invention to provide a rust-protective coating for bonding tools formed of a material subject to rusting (e.g., tool steel).

It is another object of the invention to provide a plating solution capable of simultaneous electrodeposition of two or more metals, such as osmium and platinum, from a single electrolytic solution to form an intimately dispersed alloy layer.

It is a particular object of the invention to provide a plating solution of the foregoing type having a surface tension substantially less than that of water for precise electrodeposition from solution onto microstructures.

In accordance with the above objects, a method is provided for the electrodeposition of osmium or ruthenium (herein referred to as a "hard metal"). The osmium or ruthenium are in the form of a hydrolytically stable dissociated alkali metal salt in a nonaqueous organic solvent capable of dissolving the salt in a sufficiently dissociated form for electrodeposition onto a plating substrate.

The organic solvent is characterized by a surface tension substantially below that of water. It suitably comprises a mixture of (a) lower alcohols, and (b) an aprotic solvent such as dimethyl formamide, dimethyl sulphoxide and dimethyl acetamide or mixtures of the same. A preferred solvent includes a major portion of aprotic solvent and a minor portion of the lower alcohol.

In general, alkali metal salts of the hard metal are unstable. Thus, it is preferred to form such salts in situ by reacting the alkali metal with a stable complex of the hard metal (osmium tetroxide for plating osmium and ruthenium trichloride for plating ruthenium).

Coatings of the foregoing type are particularly effective when deposited on the surfaces of microstructural bonding tools of the wedge or capillary type. A bonding tool of the foregoing type is characterized by longer wear and lower friction characteristics than that heretofore obtainable with reduced production cost.

In another form of the invention, a silicone layer is chemically bonded to the wear surface of a microstructural wire bonding tool of the foregoing type. The surface is first pretreated to form pendant —OM groups wherein M is a hydrogen or a monovalent inorganic cation and is thereafter contacted with a silane of the general formula $(R)_n Si(X)_{4-n}$ wherein $n$ varies from 0 to 3, R is an aliphatic or aromatic group and X is a halogen group or alkoxy radical. The resultant silicone layer is bonded to the hard metal layer through hard metal-oxygen-silicon bonds. The silicone layer effectively prevents galling of the wire on the bonding surface.

Additional objects and features of the invention will be apparent from the following description in which the preferred embodiments are set forth in detail.

BRIEF DESCRIPTION OF THE DRAWING

FIG. 1 is a cross-sectional view of a capillary bonding tool in an approximate scale of 10:1.

FIG. 2 is an expanded view of the tip of the bonding tool of FIG. 1 in an approximate scale of 100:1 taken at 2—2 illustrating a plated layer.

FIG. 3 is an expanded view of a portion of the tip of FIG. 2 taken at 3—3 illustrating plating depth at an approximate scale of 1000:1.

DETAILED DESCRIPTION OF THE PREFERRED EMBODIMENTS

According to the present invention, osmium or ruthenium, referred to as hard metals herein, are electrodeposited from an electrolytic solution of a novel type to form a hard metal layer of exceptionally fine grain size capable of precisely coating microstructural articles. The present description generally refers to osmium as the specific hard metal. It should be understood that, with the modifications set forth herein with respect to ruthenium, the process is applicable to ruthenium.

The electrolytic bath of the present invention uses a hydrolytically stable dissociated alkali metal salt of an osmium complex anion in a nonaqueous organic solvent. A suitable salt for this purpose is sodium osmate, $Na_2OsO_5$. However, this salt has a tendency to hydrolyze in the presence of water from the atmosphere to form $OsO_2 \cdot 2H_2O$, a non-platable sludge. Thus, it is preferable to form the sodium osmate in situ in the nonaqueous organic solvent shortly before plating.

A preferred technique for forming the sodium osmate is to add a stoichiometric excess of sodium metal to osmic acid, $OsO_4$, which is relatively stable to hydrolysis.

Referring to sodium osmate as the dissociated alkali metal salt, $OsO_5^{-2}$ is the osmium complex anion. It should be understood that other alkali metal salts of osmium may also be employed which are capable of dissociation in a nonaqueous organic solvent to a sufficient extent for electroplating the osmium.

The preferred source of alkali metal in the osmium salt is metallic sodium. Although sodium hydroxide may be employed, it is a source of water and so can lead to undesirable hydrolysis of the osmium salt. Lithium or potassium may also be employed as the alkali metal. However, the activity of lithium is less than that of sodium resulting in a slow rate of the reaction. Conversely, potassium is so active that it produces a violent reaction which can be difficult to control.

The organic solvent in the electrolytic solution is characterized by the capability of dissolving the above osmium salts and of permitting such salts to dissociate to a sufficient extent for electrodeposition. In addition, the solvent has a surface tension substantially below that of water, about 72 dynes per centimeter (dynes/cm.). It has been found that the surface tension of a water based electrolytic solution for osmium, such as set forth in U.S. Pat. No. 3,622,474, is so high as to prevent the precision plating of microstructures.

Suitable organic solvents with characteristics of the foregoing type include (a) lower alcohols such as methanol and ethanol, (b) aprotic solvents such as dimethyl formamide, dimethyl sulfoxide, dimethyl acetamide, and (c) mixtures of the above. It is preferable to employ mixtures of the lower alcohol (methanol) and an aprotic solvent.

The methanol contributes a relatively low surface tension, on the order of 25 dynes/cm., to the electrolytic solution for precise electroplating. On the other hand, methanol has a relatively high vapor pressure and so a solvent comprising 100% methanol would require frequent replenishment of solvent during long-term plating.

Another component of the solvent which is suitable is the aforementioned aprotic solvents. As defined herein, aprotic solvents are ones which permit dissociation of the osmium salt solute by the formation of solvated complexes with the metal ion without ionization of the solvent itself. Such aprotic solvents do not cause hydrolysis of the osmium salts. The solvent has a relatively high boiling point (e.g., 150°–180° C) in comparison to water, and so has a slow rate of evaporation. This enables the solvent to be used for long periods of time (e.g., one week or more) without replenishment with electroplating at room temperature. The surface tension of such solvents is on the order of 45 to 50 dynes/cm., somewhat higher than methanol but substantially lower than water. Also, the rate of deposition is slower in aprotic solvent with a corresponding improvement in the fineness of the grain size.

An optimum solvent for the above system includes a major portion of the aprotic solvent together with a minor portion of methanol. This solvent is not subject to excessive evaporation. Furthermore, the surface tension of the aprotic solvent is lowered by the inclusion of methanol. A preferable mixture includes 3 to 10 parts of aprotic solvent, and optimumly about 5 parts, for each part by volume of methanol. This mixture has a surface tension on the order of 30 to 40 dynes/cm.

When methanol is a component of the solvent system, the formation of sodium osmate from osmic acid is believed to take place according to the following formula:

$$2Na + 2CH_3OH + OsO_4 \rightarrow Na_2OsO_5 + CH_3OCH_3 + H_2$$

An analogous reaction occurs in the presence of ethanol. To conserve the relatively expensive osmic acid, the sodium and methanol are present in stoichiometric excess.

For purposes of the present specification, the term "nonaqueous" is meant to include insufficient water content to form substantial quantities of the undesirable $OsO_2 \cdot 2H_2O$ sludge, i.e., less than 2–3% for normal operating conditions, and typically on the order of 1000 ppm or less. At these low concentrations of water, the ionization of the plating salts is increased to permit adjustment in the rate of deposition without significant undesirable side effects.

The technique for osmium is essentially the same for ruthenium except that the salt which reacts with the alkali metal is ruthenium trichloride.

Osmium and ruthenium form extremely hard but somewhat brittle layers. It may be desired to form an alloy of the material with a metal which is relatively tough in comparison to these metals. Such toughening metal alloys including rhodium, iridium, palladium, platinum, silver and gold can be plated simultaneously with the osmium or ruthenium in a suitable proportion to retain the desired hardness and durability. The resultant coating is an intimately dispersed alloy yielding an extremely uniform layer. The techniques of electrodepositing alloying metal with the osmium or ruthenium is analogous to the foregoing one. Suitable salts to be added to the electrolytic bath for reaction with the sodium are set forth in the following table.

TABLE 1

| Plating Metal | Salt |
| --- | --- |
| Platinum | chloroplatinic acid |
| Palladium | palladium diamine dichloride or palladium dichloride |
| Rhodium | rhodium hexamine trichloride |
| Iridium | iridium hexamine trichloride |
| Gold | auric chloride |

In order to maintain the exceptional hardness of osmium or ruthenium, these metals comprise a majority of any alloy with toughening alloying metals and, preferably 70–90% or more.

Any suitable substrate may be employed for the electrodeposition of osmium, ruthenium or their alloys. Such substrates include metal-containing substrates, plastics and ceramics. Suitable metal-containing substrates include tungsten, tungsten carbide, tungsten steel, tool steel, rhenium, platinum, rhodium, molybdenum, titanium, hafnium, zirconium, tantalum, gold, silver, nickel, cobalt, copper, niobium, aluminum and alumina.

Electrolysis can be carried out with a bath of the foregoing type at room temperature. Suitable current density for the solution is on the order of 0.001 to 0.02 amperes per square inch.

As set forth above, the lower alcohol assists the formation of sodium osmate from metallic sodium and osmium tetroxide. Thus, where a mixed solvent comprising lower alcohol and aprotic solvent is to be employed for the electrolytic solution, it is preferable to add the alkali metal and the osmium tetroxide to the lower alcohol to form a concentrated solution to accelerate the reaction prior to dilution with the aprotic solvent. For this purpose, the ratio of osmic acid to methanol may be on the order of one gram per 20 ml. An indication that formation of sodium osmate is essentially completed is that the sodium becomes straw or orange in color. Thereafter, the aprotic solvent, e.g., dimethyl formamide, is added in sufficient quantity to dilute the osmium to a level for a desired rate of deposition and the solution becomes blue-green.

The rate of deposition is dependent upon temperature, and concentration of plating ion. A desired rate is the formation of a layer of about 0.00005 to 0.0002 inches per hour. At room temperature a suitable concentration of plating ion in solution for this purpose is on the order of 0.1 to 10 grams per liter and preferably about 1 to 5 gm/l. A slower rate produces a finer grain size to the layer which is desirable for precise plating of microstructures. A rate of 0.00005 to 0.0001 inch/hour is desirable for fine grain size. The rate of deposition may also be increased by lowering the proportion of aprotic solvent to that of the lower alcohol.

An electrodeposition process of the foregoing type is capable of forming a layer of a desired thickness ranging from less than 0.0001 inch to 0.001 inch or more. Also, the layer has an extremely fine grain size ranging from 5 to 15 microinches based on a 3–5 microinch substrate using a scribe technique mechanical measurement of microfinish. This renders the present process capable of precision coating of microstructures. For example, it is capable of uniformly coating the bonding surface and opening of a capillary bonding tool of the type described hereinafter which includes an opening on the order of 0.0017 inch.

In accordance with another embodiment of the invention, the metal working surfaces of wire bonding tools of the capillary or wedge type set forth herein are coated with a nongalling silicone layer. This is accomplished by treating such surfaces to form pendant hydroxyl groups. Thereafter, the treated surface is contacted with a silane of the general formula $(R)_n Si(X)_{4-n}$ wherein $n$ varies from 0 to 3, R is an aliphatic or aromatic group and X is a halogen or alkoxy radical.

In the step of forming the hydroxyl groups, the metal surface is first treated with an inorganic base to form linkages between the hard metal and the cation of the hydroxide. In the case of sodium hydroxide, the linkage is $-O^-Na^+$. This is accomplished by anodically etching the metal surface in the presence of the base to form oxygen atoms on the surface of the metal which react with the base cation. A suitable potential to be applied is 0.1 to 1 volt for 5 to 10 seconds. The thus treated metal substrate may then be directly reacted with a silane of the foregoing type to produce a coating including metal-oxygen-silicon bonds.

In the above process, the reaction between the $-O^-Na^+$ and the silane of the above general formula results in the formation of a salt by-product which can become incorporated into the layer. Such salt formation, which may cause interference with the ultimate use of the product, may be avoided by washing the hydroxide treated surface with a dilute solution of an acid such as hydrochloric acid to form pendant hydroxyl groups on the surface. These hydroxyl groups are thereafter reacted with the foregoing silane.

The above alternative treatments are generalized by the formation of pendant groups of the general formula —OM, wherein M is hydrogen or an inogranic cation such as sodium, potassium, lithium, ammonium, or the like.

It is believed that when the foregoing silanes are reacted with the treated metal a silicone layer is formed which is bonded chemically to the metal in accordance with the following theoretical discussion. Silanes of the above general formula $(R)_n Si(X)_{4-n}$ produce substantially different surfaces depending upon the value of $n$. As X is the functional group, when $n$ is 0 the silane is tetrafunctional and when $n$ is 3 the silane is monofunctional. Referring to the final product, with $n = 2$, it is believed that a three dimensional network is formed with the silicon linked through one or more oxygen atoms on the metal substrate to form a three dimension silicone polymer layer as set forth below.

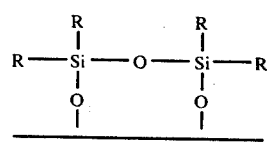

or

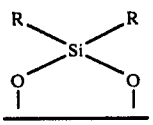

Similar silicon networks are built by the use of trifunctional silanes with more cross-linking.

In contrast to the above structures, where a monofunctional silane is employed, an uncrosslinked monomolecular silane layer is formed of the following general configuration on the surface of the substrate:

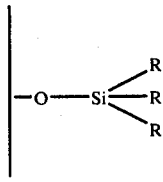

Suitable silanes for use in the present invention include dimethyl dichlorosilane, dimethyl diethoxysilane, trimethyl chlorosilane and trimethyl ethoxysilane.

The foregoing silane compounds are volatile and so may be applied either in the vapor state by moderate heating or by dipping in the liquid silane. Also, the liquid may be diluted with a suitable organic solvent such as toluene. This step is preferably carried out before the metal surface dries since the dry surface containing —OH groups is highly reactive and subject to contamination and rapid deactivation. The depth of the deposited layer and the degree of oxygen crosslinking within the same may be increased by heating in the presence of water to a sufficient temperature to split out alcohols of the general formula ROH. There is sufficient moisture in the atmosphere for this reaction to occur by heating to elevated temperatures, say, 250° C.

Referring to FIGS. 1–3, a capillary bonding tool is illustrated for which the foregoing coating techniques are particularly well suited. The bonding tool comprises an elongate tool body 11, a shank portion 12 with a tapered tip 13 terminating in a contact surface 14. Tool 11 includes a central wire guide opening 15 which tapers to a narrow opening at contact surface 14. Tool 11 is suitably formed of tungsten carbide. A layer 16 is electrodeposited from the contact surface upwardly in opening 15 to a sufficient extent to coat the area of primary wear of the bonding wire in contact with the opening during bonding. Layer 16 is formed of the hard metals osmium, ruthenium, or their alloys as set forth above. Toughening alloy metals such as platinum are advantageous to reduce the brittleness of the hard metals. The electro-deposition technique employed is to tip the tool 11 to the desired level in the bath and to cathodically deposit layer 16 to the desired thickness.

In operation of the bonding tool the wire, typically formed of aluminum or gold, projects through opening 15 under tip 13 and is forced between contact surface 14 and an associated contact area or surface for bonding against which the wire is pressed. Then suitable heat, pressure and/or ultrasonic energy is applied to create a bond. The tool is then lifted and a new contact area is brought into alignment with the tool guiding the wire. The tool is lowered and a new bond is formed. While the tool is in its lowered position pressing against the wire, the tool may be rocked and the wire is pulled whereby the precisely radiused corner 14a weakens the wire for break-off. It is highly important that this radius be accurately dimensional for the reasons set forth in my aforementioned co-pending application. The dimensional accuracy is maintained by the deposit of wear resistant coating 16.

During the rocking action of the tool, the wire can wear down the narrow portion of tool opening 15. If subjected to substantial friction, the wire can form deposits in the opening which interfere with the bonding operation or evan plug the opening. This is avoided by the deposit of coating 16 which is wear resistant and has a low coefficient of friction.

A bonding tool of the type described in U.S. Pat. No. 3,627,192 has a typical life on the order of 100,000 – 200,000 bonds. In contrast, one million or more effective bonds may be made with a tool with layer 16. This layer can be deposited to a grain size on the order of 5 to 25 microinches. A grain size less than 15 microinches is preferred to precisely conform to the critical dimensions of the bonding tool such as corner 14a.

A silicone layer may be deposited onto layer 16 with the highly beneficial result that it prevents galling, i.e., sticking of the heated wire to the metal surface. The silicone layer depth may vary from minute monomolecular thickness to a substantially thicker highly crosslinked three dimensional network. The maximum layer depth is extremely shallow being barely visible. A tool with such a silicone layer on the contact area is capable of forming a superior bond from the first application in contrast to the typical requirement of at least about a dozen wire test bonds without the layer.

Typical dimensions for the capillary bonding tool of FIGS. 1–3 are as follows: (a) diameter of shank 12 – 0.0625 inch; (b) maximum inner diameter of opening 15 – 0.043 inch; (c) minimum inner diameter of opening 15 – 0.0018 inch; (d) height of layer 16 – 0.01 to 0.03 inch; (e) thickness of layer 16 – 0.0001 to 0.0003 inch.

Although a particular capillary bonding tool is set forth above, the electrodeposited layer of the present invention is also highly advantageous for other capillary bonding tools and of wedge bonding tools, as of the type set forth in the aforementioned co-pending application.

The foregoing description stresses the bonded silicone protective layer attached to an electrodeposited layer of osmium, ruthenium or their alloys, such as formed on the working surface of a wire bonding tool. It should be understood that such silicone protective layer provides a nongalling characteristic to wire bonding tool working surfaces formed of other metals such as tungsten carbide, titanium carbide, tool steel, and the like. The last named metal is subject to rusting. For tool steel and any other metal of a similar property, the silicone layer serves as a rust-protective as well as nongalling surface. It has been found that a silicone layer of the foregoing type deposited onto a metal surface is electrically insulative at a potential on the order of 6–12 volts.

In order to more clearly disclose the nature of the present invention, a number of specific examples of the practice of the same are given herein. It is to be understood, however, that this is done by way of example and is intended neither to delineate the scope of the invention nor limit that of the appended claims.

EXAMPLE 1

An electrolytic solution for plating osmium is formed as follows. Sodium metal (0.5 grams) together with osmic acid (0.25 grams) are dissolved in 5 ml. of methanol in the glove box of a fume hood. When the reaction is essentially complete, the solution turns a straw to orange color. Thereafter, dimethyl formamide (50 ml.) is added which dilutes this solution. When this solution turns a bluish green, it is ready for electroplating.

A tungsten carbide capillary tool of the foregoing type is employed as a cathode for electrodepositing of osmium with a conventional stainless steel anode. The tool is dipped in solution to a level illustrated in FIG. 2. The current is then applied at a potential of 2 volts. In approximately 2 hours, a 0.002 inch layer of osmium is deposited upon the tungsten carbide tool.

The above tool is capable of bonding about 1 million or more effective wire bonds.

EXAMPLE 2

The foregoing Example is repeated with the addition of chloroplatinic acid (0.01 grams) to the plating solution. An alloy of osmium and platinum is formed.

EXAMPLE 3

This procedure relates to the coating of a silicone layer onto the electrodeposited surface of Example 1. The surface is first treated with an aqueous solution of about 1% sodium hydroxide and etched at a voltage of approximately 1 volt for about 5 seconds. Thereafter, the surface is washed with concentrated hydrochloric acid and is exposed to dimethyl dichlorosilane in the vapor phase. This procedure is repeated with trimethyl chlorosilane in place of dimethyl dichlorosilane. After completion of this reaction, the surfaces are heated to 250° C in air.

The above surfaces are nongalling and are capable of forming an aluminum lead-wire bond to a semiconductor from the first bond and thereafter.

I claim:

1. A method for the electrodeposition of the hard metal osmium, or alloys thereof comprising the steps of forming an electrolyte solution consisting essentially of a dissociated alkali metal salt of a complex of osmium as the anion in a nonaqueous organic solvent capable of dissolving said salt in ionized form and electrolytically depositing the hard metal from the solution onto a plating substrate comprising the cathode, said organic solvent consisting essentially of a major portion of aprotic solvent and a minor portion of lower alcohol.

2. A method as in claim 1 in which the substrate consists essentially of a metal-containing material selected from the group consisting of tungsten, tungsten carbide, tungsten steel, tool steel, rhenium, platinum, rhodium, molybdenum, titanium, hafnium, zirconium, tantalum, gold, silver, nickel, cobalt, copper, niobium, aluminum, alumina, and alloys thereof.

3. A method as in claim 1 in which the hard metal is deposited as an alloy with a compatible metal selected from the group consisting of rhodium, iridium, palladium, platinum and gold.

4. A method as in claim 1 in which the hard metal complex of the alkali metal salt is osmium pentoxide.

5. A method as in claim 1 in which the organic solvent is characterized by a surface tension substantially below that of water.

6. A method as in claim 1 in which the lower alcohols are selected from the group consisting of methanol and ethanol.

7. A method as in claim 1 in which the aprotic solvent is selected from the group consisting of dimethyl formamide, dimethyl sulphoxide, dimethyl acetamide, and combinations of the same.

8. A method as in claim 1 in which the alkali metal salt is selected from the group consisting of sodium, lithium and potassium.

9. A method as in claim 1 in which the alkali metal salt is formed by mixing the alkali metal with an ionizable salt of the hard metal.

10. A method as in claim 9 in which the alkali metal salt is formed in a portion of the organic solvent comprising a lower alcohol, and thereafter the remainder of the organic solvent comprising aprotic solvent is added prior to electrolytic deposition.

11. A method as in claim 9 in which the ionizable salt comprises osmium tetroxide.

12. A method as in claim 3 in which the alloy comprises said hard metal and platinum.

13. A method as in claim 1 in which the plating substrate is the surface of a microstructural bonding tool for holding a bonding wire against a surface to which the wire is to be bonded during application of energy thereto, which tool comprises an elongate tool body having a wire guide opening and a bonding surface at the end thereof.

14. A method as in claim 1 in which a silicone layer is deposited onto the surface of the electrolytically deposited hard metal substrate.

15. A method as in claim 14 in which the silicone layer is formed by treating the surface of the hard metal substrate to form pendant groups of the general formula —OM wherein M is hydrogen or a cation having a valence of one and contacting the treated surface with a silane of the general formula $(R)_n Si(X)_{4-n}$ wherein $n$ varies from 0 to 3, R is an aliphatic or aromatic group and X is a halogen group or alkoxy radical.

16. A method as in claim 15 in which the —OM groups are formed by electrolytically reacting the hard metal surface with a base.

17. A method as in claim 16 in which the base-reacted surface is washed with an acid to form hydroxyl groups before contact with the silane.

18. A method as in claim 15 in which the silane is selected from the group consisting of dimethyl dichlorosilane, dimethyl diethoxysilane, trimethyl chlorosilane, and trimethyl ethoxysilane.

19. An electrolytic solution for depositing the hard metal osmium onto a substrate, said solution consisting essentially of a dissociated alkali metal salt of an oxide complex of osmium in a nonaqueous organic solvent consisting essentially of a major portion of aprotic solvent and a minor portion of a lower alcohol.

20. An electrolytic solution as in claim 19 together with a dissociated alkali metal salt of a complex of a hard metal compatible alloying metal selected from the group consisting of rhodium, iridium, palladium, platinum and gold.

21. A solution as in claim 19 in which the hard metal is osmium and the hard metal ion of the alkali metal salt is osmium pentoxide.

22. A solution as in claim 19 in which the organic solvent is characterized by a surface tension substantially lower than that of water.

23. A solution as in claim 19 in which the organic solvent is selected from the group consisting of lower alcohols, aprotic solvents and mixtures thereof.

24. A solution as in claim 19 in which the aprotic solvent is selected from the group consisting of dimethyl formamide, dimethyl sulphoxide, dimethyl acetamide, and combinations of the same.

25. An electroplated substrate formed by the process of claim 1.

26. In a microstructural bonding tool for holding a bonding wire against a surface to which the wire is to be bonded during application of energy thereto, which tool comprises an elongate tool body having wire guide means and a bonding surface at the end thereof, a layer on said tool of electrodeposited hard metal selected from the group consisting of osmium, ruthenium or alloys of the same, said layer being characterized by a grain size less than 15 microinches.

27. An article as in claim 26 in which the layer is an alloy of the hard metal with a compatible metal selected from the group consisting of rhodium, iridium, palladium, platinum and gold.

28. An article as in claim 26 in which the layer is an alloy in intimate dispersion.

29. An article as in claim 28 in which the layer is an osmium-platinum alloy.

30. An article as in claim 26 in which a silicone layer is bonded to the electrodeposited hard metal layer surface.

* * * * *